(12) United States Patent
Lourens et al.

(10) Patent No.: US 7,324,615 B2
(45) Date of Patent: Jan. 29, 2008

(54) TIME SIGNAL RECEIVER AND DECODER

(75) Inventors: Ruan Lourens, Chandler, AZ (US); Layton W. Eagar, Chandler, AZ (US); Russell Eugene Cooper, Mesa, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 779 days.

(21) Appl. No.: 10/736,372

(22) Filed: Dec. 15, 2003

(65) Prior Publication Data

US 2005/0129156 A1 Jun. 16, 2005

(51) Int. Cl.
*H04B 1/00* (2006.01)
*H04B 1/18* (2006.01)

(52) U.S. Cl. .................... 375/343; 455/181.1

(58) Field of Classification Search ............... 375/316, 375/340, 344–346, 350; 455/39, 130, 150.1, 455/307, 161.1, 161.2, 164.2, 179.1, 181.1, 455/181.2, 230, 232.1, 234.2
See application file for complete search history.

(56) References Cited

U.S. PATENT DOCUMENTS

| | | | | |
|---|---|---|---|---|
| 3,643,173 A | * | 2/1972 | Whitten | 330/253 |
| 3,670,242 A | * | 6/1972 | McGarvey | 340/7.49 |
| 3,984,835 A | * | 10/1976 | Kaplan et al. | 342/44 |
| 4,246,542 A | | 1/1981 | Thanos | 330/107 |
| 4,455,674 A | * | 6/1984 | Sano | 381/15 |
| 4,463,221 A | * | 7/1984 | Soulliard et al. | 455/554.1 |
| 4,479,254 A | * | 10/1984 | Craiglow | 455/239.1 |
| 4,641,374 A | * | 2/1987 | Oyama | 398/115 |
| 4,984,292 A | | 1/1991 | Millen | 455/40 |
| 6,002,925 A | * | 12/1999 | Vu et al. | 455/313 |
| 6,236,223 B1 | * | 5/2001 | Brady et al. | 324/765 |
| 6,356,602 B1 | * | 3/2002 | Rodal et al. | 375/344 |
| 6,608,527 B2 | | 8/2003 | Moloudi et al. | 330/301 |
| 7,184,556 B1 | * | 2/2007 | Johnson et al. | 381/61 |
| 2003/0060185 A1 | * | 3/2003 | Fisher et al. | 455/344 |
| 2004/0063413 A1 | * | 4/2004 | Schaffer et al. | 455/234.1 |

FOREIGN PATENT DOCUMENTS

| | | |
|---|---|---|
| DE | 3531548 A1 | 3/1987 |
| DE | 3720400 C1 | 1/1989 |
| EP | 0814390 A2 | 12/1997 |

OTHER PUBLICATIONS

Notification of Transmittal of the International Search Report and the Written Opinion for PCT/US2004/041604, 12 pgs.

* cited by examiner

*Primary Examiner*—Mohammed Ghayour
*Assistant Examiner*—Vineeta Panwalkar
(74) *Attorney, Agent, or Firm*—Baker Botts L.L.P.

(57) ABSTRACT

A time signal receiver and decoder receives, detects and stores time information from time signals, e.g., WWV, WWVH, WWVB (USA), JJY (Japan), MSF (UK) and the like. The time information may be used for a self setting clock, and the clock may be used as a reference in time sensitive applications, devices and systems. The time signal receiver may use a high-Q state variable bandpass filter or an anti-notch filter circuit for selectivity at the time signal frequency of interest. The decoder is coupled to the time signal receiver, decodes the time information in the received time signal and may store the decoded time information.

18 Claims, 6 Drawing Sheets

TIME SIGNAL RECEIVER AND DECODER

RELATED PATENT APPLICATIONS

This application is related to commonly owned U.S. patent application Ser. No. 10/670,619, filed Sep. 25, 2003, entitled "Q-Quenching Super-Regenerative Receiver," by Ruan Lourens, hereby incorporated by reference herein for all purposes.

FIELD OF THE INVENTION

The present invention relates generally to devices using radio time signals for accurately setting time, and more particularly to a time signal low frequency radio receiver and decoder.

BACKGROUND OF THE INVENTION TECHNOLOGY

Apparatus and systems requiring accurate time information may be for example, but not limited to, clocks, time of use utility meters, traffic lights; bus, train and plane scheduling apparatus; speed measuring instruments used in combination with global positioning satellite (GPS) devices, timers, parking meters, and the like. The market for low cost and sensitive radio frequency receivers for receiving time signals is enormous and current technology solutions are fairly expensive. Low frequency (LF) receivers may be used for self-setting clocks that receive the National Institute of Standards and Technology (NIST) WWVB time information and are used in high-end consumer and industrial applications. The cost of such receivers keep this technology out of the mass markets such as energy metering and lower end consumer electronics.

Various radio frequencies are used to transmit this time standard. The NIST radio station WWVB transmits at a very low frequency (VLF) of 60 kHz and effectively distributes standard time information to better than one second throughout the North American continent. Other VLF time standard transmitting sites are in the far east—JJY (Japan) and Europe—MSF (UK). NIST WWV also transmits time information in the high frequency (HF) radio spectrum.

The NIST radio stations (e.g., WWV, WWVH, WWVB) are continuously being used for both precise frequency and time calibration. The demand for precise frequency and time calibration is constantly growing as manufacturers continue to create new, lower cost products, in an effort to place "Atomic Time" in every home and office. However, acceptance of highly accurate and automatically set time appliances is greatly dependent upon cost and ease in implementation. Integrated circuit technologies have reduced the cost of time measurement, recording and display systems, e.g., digital clocks, parking meters, etc. However, complex and expensive receiving equipment is presently used to receive the time signals from the NIST radio stations. Existing low frequency radio time signal receivers are based upon high gain amplifiers with crystal filters to achieve good frequency selectivity, e.g., direct conversion receivers. The crystal filters are expensive and difficult to tune to a frequency that accurately coincides with the time signal frequency.

Therefore, what is needed is a low cost time signal receiver that receives time signals from the NIST radio stations and the like, and through time signal decoding makes the precise time available as decoded time information. In addition, it is desired that a low cost and sensitive time signal receiver may easily be fabricated in an integrated circuit.

SUMMARY OF THE INVENTION

The invention overcomes the above-identified problems as well as other shortcomings and deficiencies of existing technologies by providing a time signal receiver and decoder for receiving time signals and producing useful and accurate time information therefrom. The time signal receiver may be a direct conversion receiver comprising a high gain anti-notch filter amplifier configured as a bandpass circuit. The decoder may be a digital processor coupled to a demodulated output of the time signal receiver. The time signal receiver receives and demodulates time information from time signals, e.g., VWVB (USA), JJY (Japan), MSF (Europe) and the like. The digital processor, e.g., microcontroller, microprocessor, programmable logic array (PLA), application specific integrated circuit (ASIC), digital signal processor (DSP) and the like, may decode the time information in the time signal and then store the decoded time information. The digital processor may also control the characteristics of the time signal receiver to further improve reception performance thereof and/or control a separate logic circuit that may perform the time decoding of the demodulated time signal.

The time signal receiver and decoder may be used to supply accurate time to apparatus and systems requiring accurate time determination, e.g., clocks, time of use utility meters, traffic lights; bus, train and plane scheduling apparatus; speed measuring instruments used in combination with global positioning satellite (GPS) devices, timers, parking meters, and the like.

In accordance with an exemplary embodiment of the present invention, a direct conversion tuned radio frequency receiver uses a variable gain amplifier (VGA), a high-Q state variable bandpass filter and an amplitude modulation (AM) envelope detector to receive time signals at a certain radio frequency, e.g., 60 kHz—WWVB. The high-Q state variable bandpass filter may comprise three amplifier state variable filter having independent control of the center frequency (Fc) and Q. The high-Q state variable bandpass filter may be utilized as a narrow band filter having very high-Q without the need for a crystal bandpass filter. The AM envelope detector may include a full wave bridge rectifier followed by a low pass filter, a data voltage comparator, a high signal comparator and a low signal comparator. The AM envelope detector may also have a carrier frequency clock output that may be differential, and a detected envelope output. A controllable tuning network may be coupled to a tuned parallel resonant antenna circuit so as to improve the operational reception sensitivity of the direct conversion tuned radio frequency receiver. The time signal receiver may be controlled with a digital processor.

In accordance with another exemplary embodiment of the present invention, a direct conversion tuned radio frequency receiver uses a resonant anti-notch filter to receive time signals at a certain radio frequency, e.g., 60 kHz—WWVB. The anti-notch filter of the present invention comprises a bridged differentiator circuit in combination with a high gain amplifier, e.g., operational amplifier. The bridged differentiator circuit allows independent adjustments of circuit Q and resonant frequency (Fc). The bridged differentiator circuit may be utilized as a narrow band filter having very high Q without the need for a crystal bandpass filter. The decoder may include a mixed signal decoder comprising a frequency-to-voltage converter, low pass filters and a voltage comparator. The decoder may also comprise a timer and a digital filter.

The present invention may be fabricated in one or more integrated circuit dice un-packaged on a leadframe or substrate, or encapsulated in a plastic, epoxy and/or ceramic integrated circuit package, e.g., PDIP, SOIC, MSOP, TSSOP, QSOP and the like.

A technical advantage of the present invention is to fabricate the receiver in an integrated circuit. Another technical advantage is low power operation. Yet another technical advantage is efficient detection of digitally modulated data signals, e.g., WWVB. Another technical advantage is independent adjustment of quality (Q) and center frequency tuning. Still another technical advantage is signal carrier frequency determination. Still another technical advantage is high and low signal strength protection of the circuits of the direct conversion receiver.

Features and advantages of the invention will be apparent from the following description of the embodiments, given for the purpose of disclosure and taken in conjunction with the accompanying drawing.

BRIEF DESCRIPTION OF THE DRAWING

A more complete understanding of the present disclosure and advantages thereof may be acquired by referring to the following description taken in conjunction with the accompanying drawing, wherein.

Figure 1:
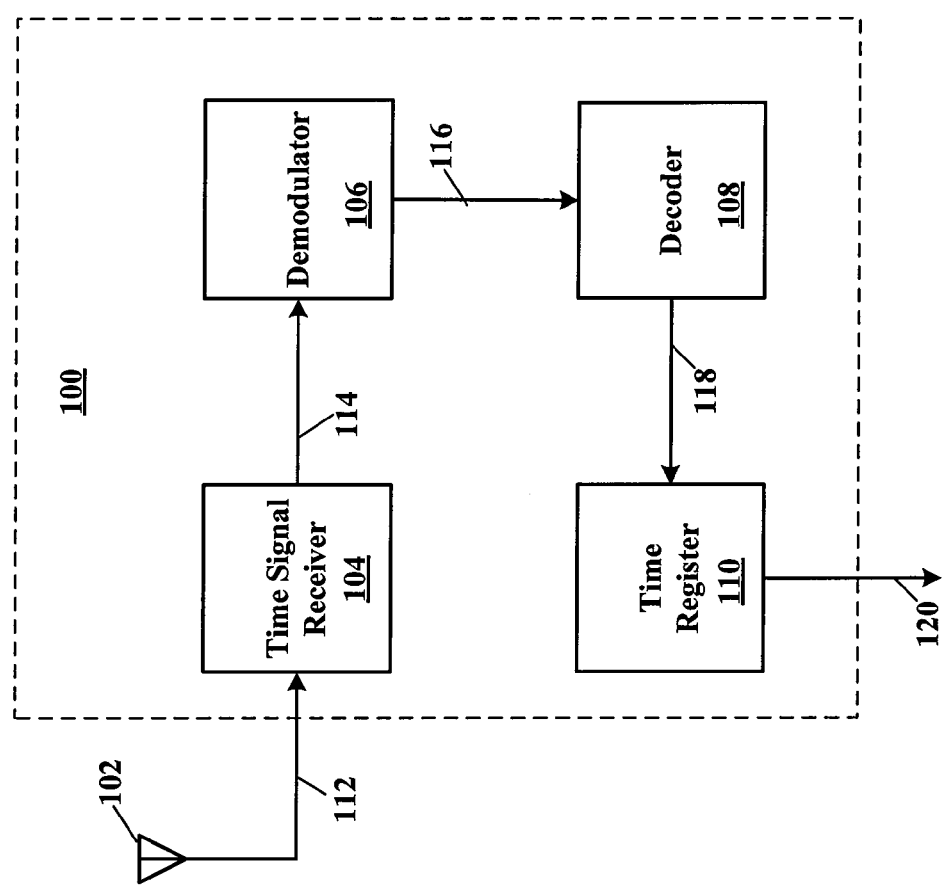
FIG. 1 illustrates a general schematic block diagram of time signal receivers and decoders, according to exemplary embodiments of the present invention.

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Referring now to the drawings, the details of exemplary embodiments of the present invention are schematically illustrated. Like elements in the drawing will be represented by like numbers, and similar elements will be represented by like numbers with a different lower case letter suffix.

Referring to FIG. 1, depicted is a general schematic block diagram of time signal receivers and decoders, according to an exemplary embodiments of the present invention. A time signal, e.g., WWV, WWV, WWVB (VB USA); JJY (Japan), MSF (UK) and the like, may be received on antenna 102, the received time signal 112 is coupled to an input of a time signal receiver 104 which separates the time signal from other unwanted signals and amplifies the desired time signal sufficiently for demodulation and decoding thereof. An amplified time signal 114 is applied to a demodulator 106 which demodulates the time signal information from the amplified time signal 114. The demodulated time signal 116 may be decoded by the decoder 108 into time signal information 118 depicting accurate time. The decoded time signal information 118 may be stored in a time register 110 for use by external devices (not shown). Accurate time information is available on an output 120 of the time register 110. The time signal receiver 104 and decoder 108 may be fabricated in an integrated circuit die or dice, generally represented by the numeral 100. The die or dice 100 may be on leadframe, un-packaged or encapsulated in an integrated circuit package, e.g., PDIP, SOIC, MSOP, TSSOP, QSOP and the like. It is contemplated and within the scope of the present invention that the decoder 108 may perform both the demodulation/detection of the time signal as well as the time signal decoding to obtain the time information. The time register 110 is also optional since a device or system requiring the time information may obtain the time information directly from the decoder 108.

Figure 2:
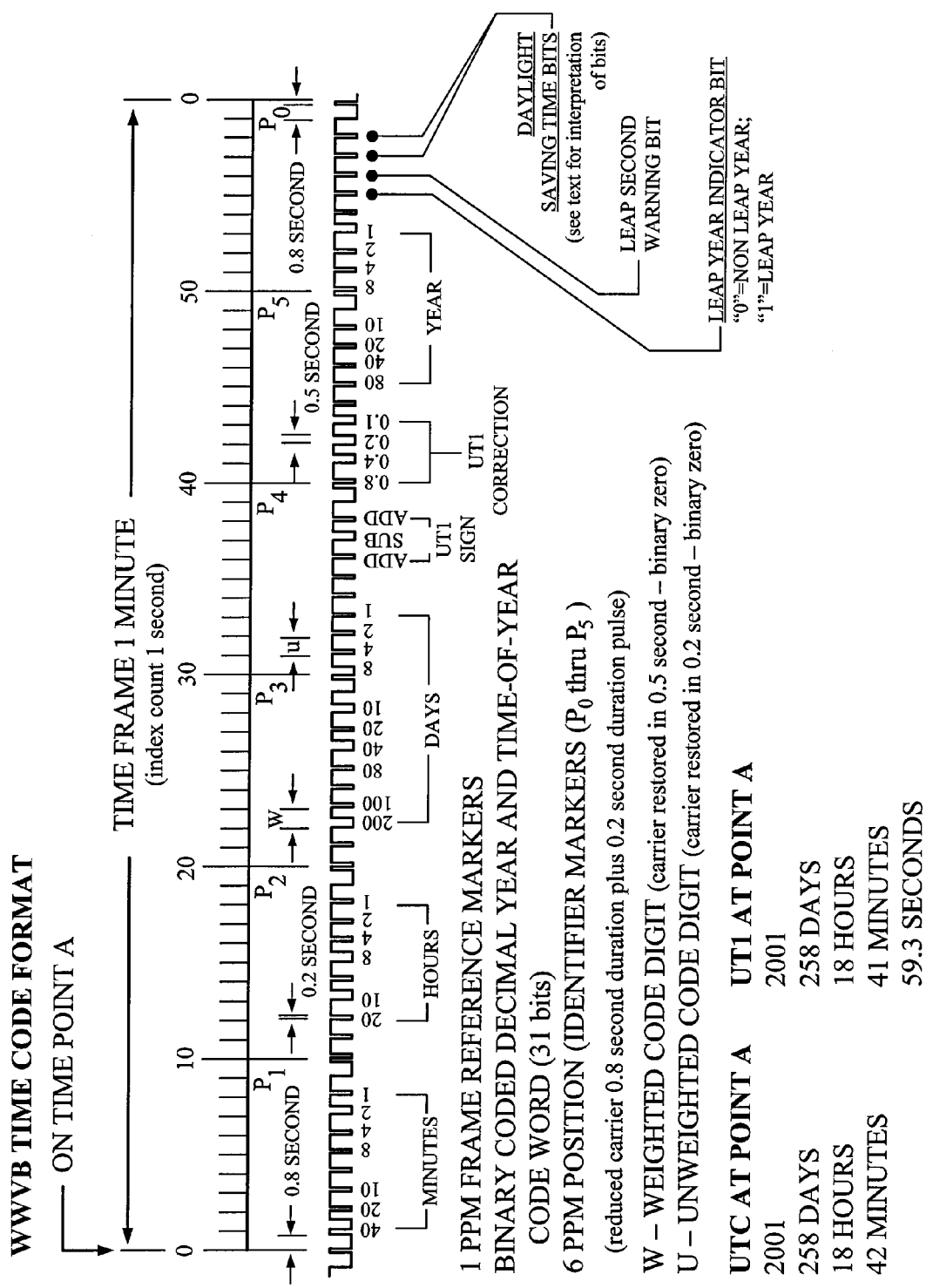
FIG. 2 illustrates the time code format of NIST radio station WWVB.

Referring to FIG. 2, depicted is the time code format of NIST radio station WWVB. The time signal receiver 104 receives the WWVB time coded signal at 60 kHz and the demodulator 106 demodulates the WWVB time code format of the time signal and the decoder 108 detects the demodulated pulse amplitudes and timing of the pulses from the demodulated time signal.

Figure 3:
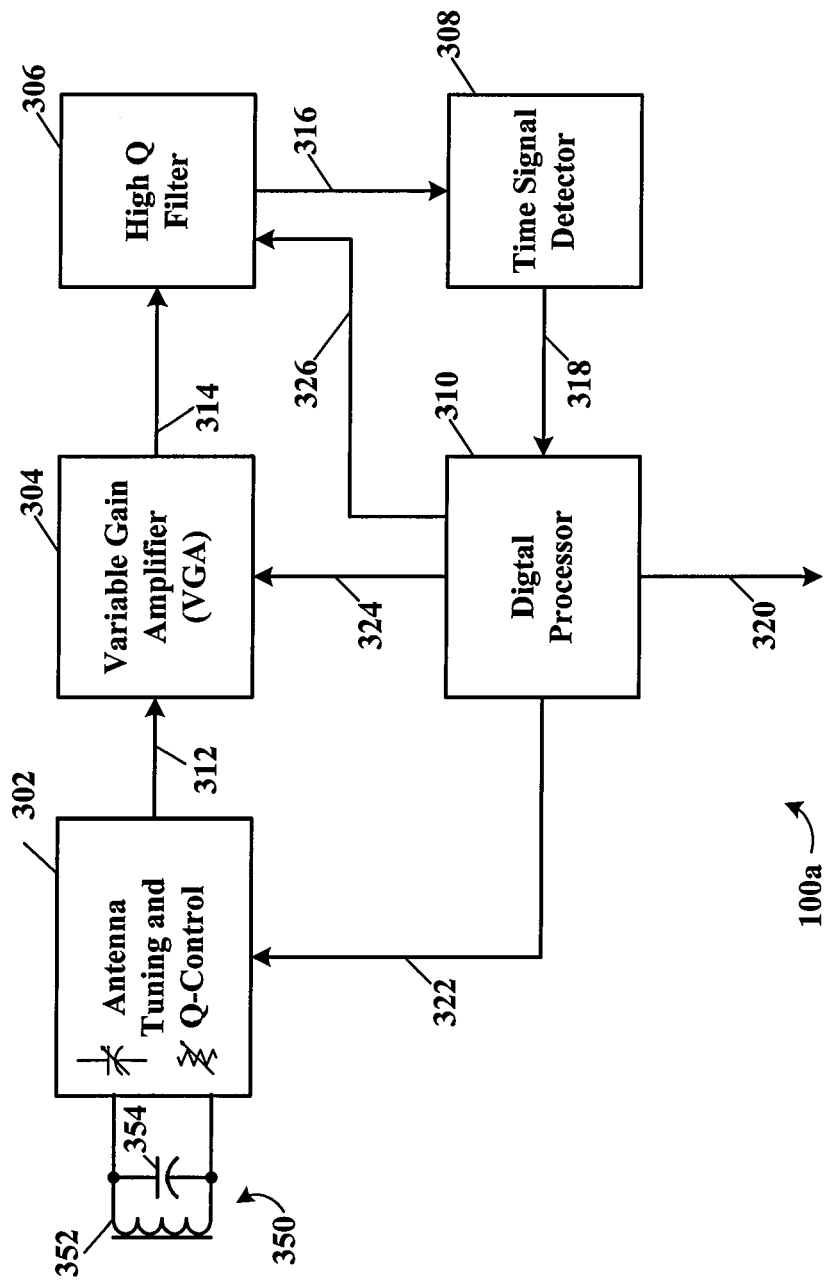
FIG. 3 illustrates a schematic block diagram of a time signal receiver, according to an exemplary embodiment of the present invention.

Referring to FIG. 3, depicted is a schematic block diagram of a time signal receiver, according to an exemplary embodiment of the present invention. The time signal receiver, generally represented by the numeral 100a, comprises an antenna 350, a variable gain amplifier (VGA) 304, a high-Q state variable bandpass filter 306, and a time signal detector 308. In addition, the time signal receiver 100a may also include an antenna tuning and Q-control unit 302 and a digital processor 310.

The antenna 350 comprises a discreet external inductor 352. The capacitor 354 may be external and/or internal depending upon the circuit configuration desired. Preferably, the inductor 352 and capacitor 354 are configured as a parallel resonant tuned circuit. Preferably, the inductor 352 may be a close wound coil of insulated wire over a ferromagnetic core. The antenna 350, being resonant at a desired frequency, is adapted to generate an induced electric current from the magnetic component of a time signal. The optional antenna tuner 302 may be used to change the resonant frequency of the antenna 350 and/or tune for maximum signal strength of the received time signal. The antenna 350 may also be "de-Qed" by resistive loading by the antenna tuning and Q-control unit 302 so as to limit excessive voltages from damaging the receiver input circuit, and may also be used to increase the dynamic signal range of the receiver 100a.

The antenna 350 and the high-Q state variable bandpass filter 306 may be tuned to a desired radio frequency time signal. Preferably the frequency tuning range may be from about 38 kHz to about 77 kHz.

The VGA 304 may have a high impedance input and a low impedance output. The high impedance input is adapted for coupling to the parallel resonant tuned circuit antenna 350. The VGA 304 gain and/or attenuation may be controlled with the antenna tuner 302 and/or the aforementioned resistive loading through a gain control input 322 from, for example but not limited to, the digital processor 310. The time signal strength varies across a wide dynamic range depending upon location of the time receiver 100a and time of day. The VGA 304 maintains a substantially constant signal level output to the high-Q state variable bandpass filter 306. The VGA 304 may also be placed into a low power inactive or "sleep" state for conservation of power in battery powered time systems, e.g., parking meters, gas meters, clocks, remote beacons, etc. The gain and/or attenuation of the VGA 304 is selected for the dynamic range of time signal strengths expected in the applications that use the time signal receiver 100a. The gain and/or attenuation steps of the VGA 304 may be of any increment, e.g., 1 dB, 2.5 dB, 6 dB, etc., depending upon desired dynamic range and the number of control bits available at the gain control input 322.

The digital processor 310, e.g., microcontroller, microprocessor, programmable logic array (PLA), application specific integrated circuit (ASIC), digital signal processor (DSP) and the like, may control the VGA 304, high-Q state variable bandpass filter 306 and the antenna tuning and Q-control unit 302. The time signal detector 308 may supply demodulated time signal information to the digital processor 310, and, in addition, information signals such as high and low detected signal strength and/or signal carrier frequency.

Figure 4:
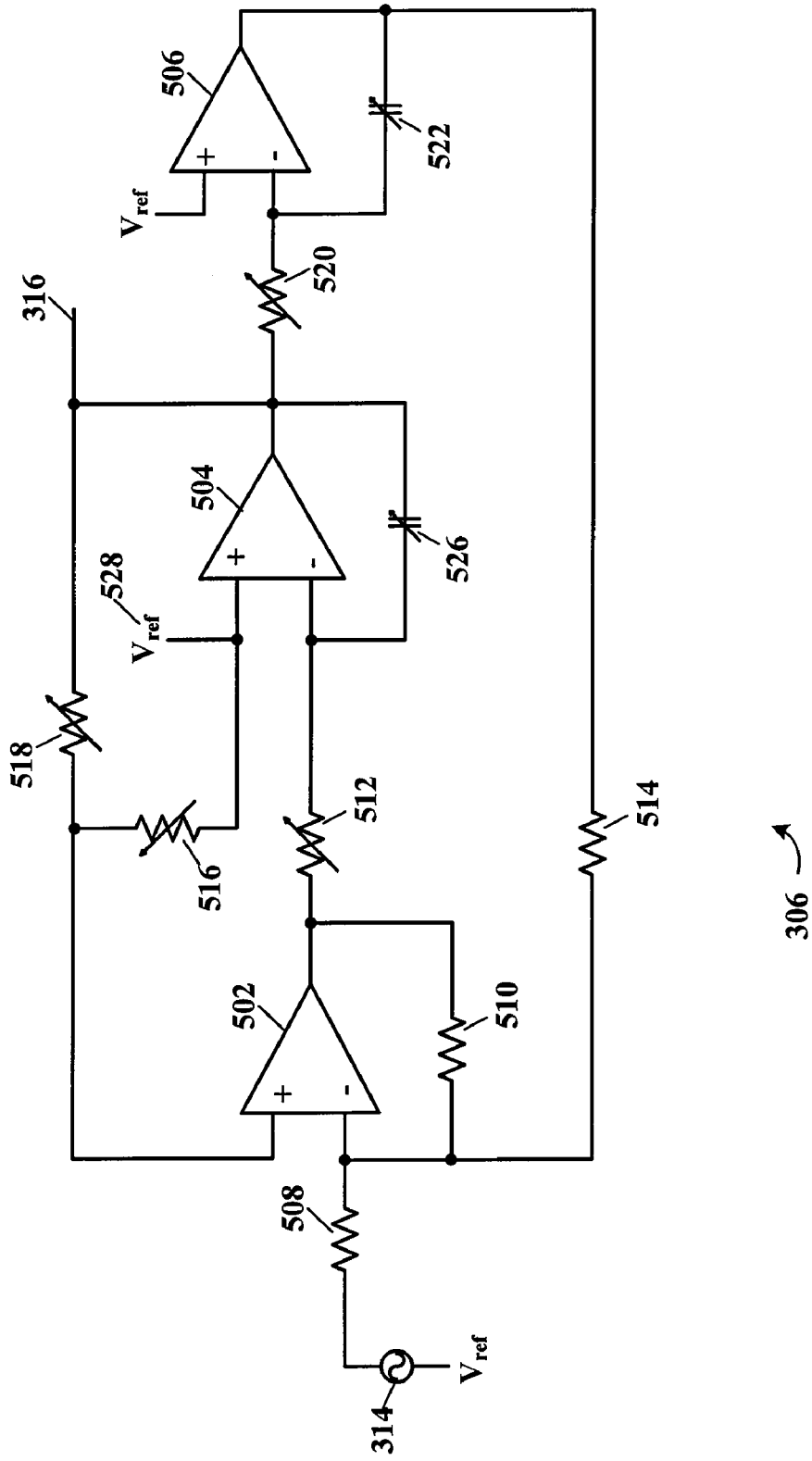
FIG. 4 illustrates a schematic diagram of a high-Q state variable bandpass filter of the time signal receiver of FIG. 3.

Referring to FIG. 4, depicted is a schematic diagram of an exemplary high-Q state variable bandpass filter of the receiver of FIG. 3. The exemplary high-Q state variable bandpass filter 306 may be implemented, for example, as a three-amplifier state variable filter or four-amplifier bi-quad filter (only state variable filter circuit is shown in FIG. 4) having substantially independent control of the center frequency (Fc) and Q (bandwidth). Excellent frequency selectivity may be obtained from the high-Q state variable bandpass filter 306 without the need for a crystal filter. Not requiring a crystal filter for frequency selectivity allows the high-Q state variable bandpass filter 306 to easily and economically be used over a range of frequencies that cover any of the time signal standards throughout the world.

Changing the center frequency (Fc) may be accomplished by adjusting the resistor-capacitor (RC) time constants of the two integrator amplifiers 504 and 506, of the state variable bandpass filter 306. The center frequency (Fc) adjustment may be performed in different stages, having some overlap between stages so as to overcome a large monotonic range had there been no overlap, via adjustable resistor 512, adjustable capacitor 526, adjustable resistor 520 and adjustable capacitor 522. The frequency adjustment may be digitally controlled for a wide frequency adjustment range and fine granularity of frequency steps during adjustment thereof.

The Q (bandwidth) of the high-Q state variable bandpass filter 306 may be adjusted by changing the voltage feedback ratio determined by adjustable resistors 516 and 518. The adjustable resistors 516 and 518 may be digitally controlled. The Q (bandwidth) of the high-Q state variable bandpass filter 306 may be adjusted in small steps, preferably, from about several hundred to about several thousand. Most preferably from about a Q of 200 to about a Q of 2000.

Resistors 508 and 510 set the gain of amplifier 502. Resistor 514 sets the overall gain of the integrator amplifiers of the high-Q state variable bandpass filter 306. $V_{ref}$ may be a high stability precision bandgap reference as more fully described in commonly owned U.S. Pat. No. 6,384,670, which is hereby incorporated by reference herein for all purposes.

Figure 5:
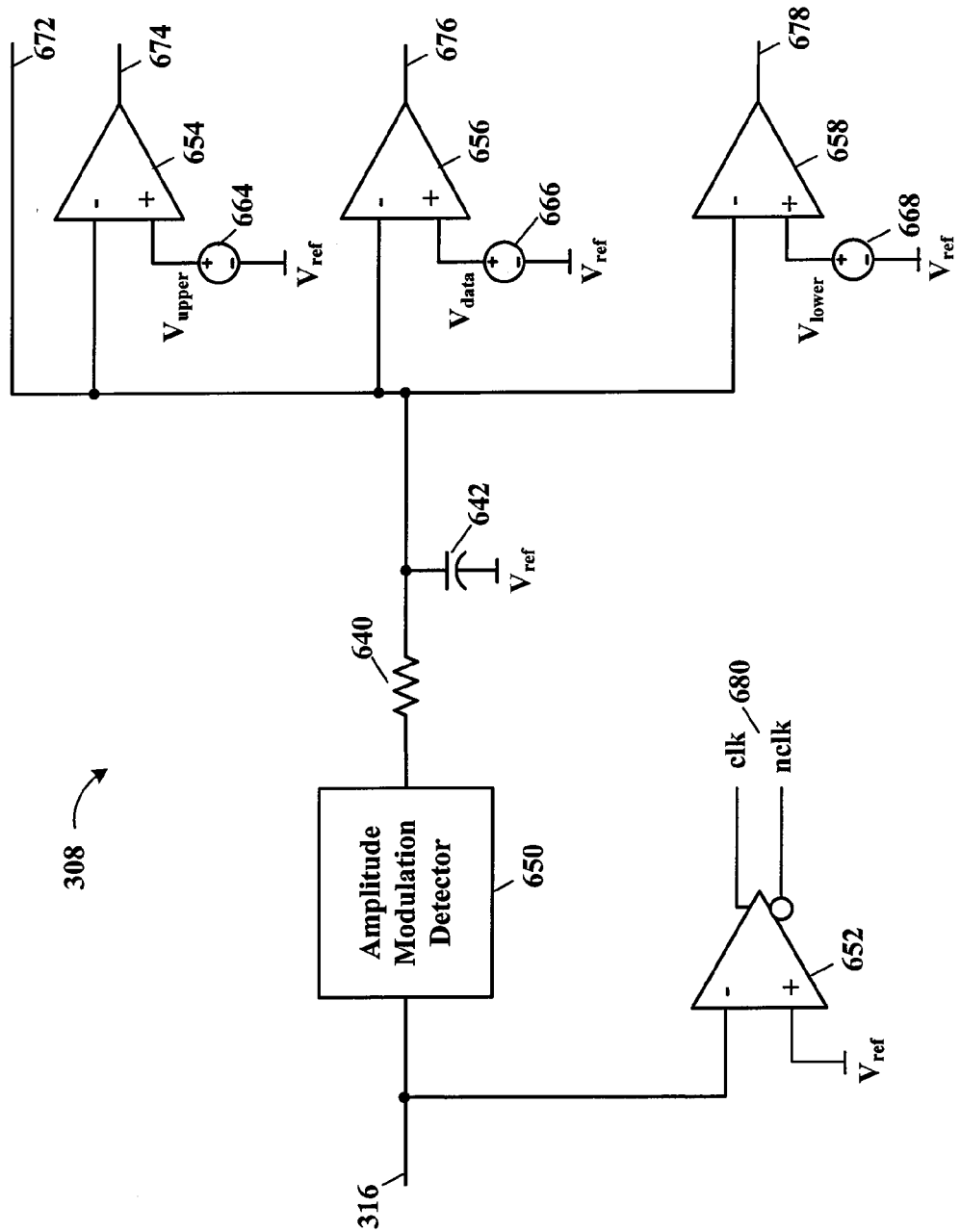
FIG. 5 illustrates a schematic diagram of an amplitude modulation envelope detector and signal strength determination circuit of the time signal receiver of FIG. 3.

Referring now to FIG. 5, depicted is a schematic diagram of an amplitude modulation envelope detector and signal strength determination circuit of the time signal receiver of FIG. 3. The time signal detector 308 comprises an amplitude modulation (AM) envelope detector 650, a low pass filter comprising resistor 640 and capacitor 642, and a data comparator 656. In addition, a high signal strength comparator 654, a low signal strength comparator 658, and time signal carrier frequency comparator 652 having a differential clock output 680, may be included with the time signal detector 308.

The AM detector 650 rectifies the amplitude modulated envelope from the amplified and selectively filtered time signal 316. The amplitude modulated envelope contains the time signal information which is filtered by the low pass filter of resistor 640 and capacitor 642, to remove the time signal carrier frequency component and to produce a direct current voltage proportional to the signal strength of the received time signal. The data comparator 656 compares the AM detected time signal with a voltage reference level 666 and has an output 676 with the time signal information represented by high and low logic levels suitable for use with digital logic circuits. The analog time signal envelope information is available at node 672.

The comparator 652 may be used to condition the time signal frequency for measurement by other digital logic (not shown). A differential digital logic level clock signal 680 is available for that purpose.

The data comparator 656 preferably works most efficiently over a defined range of input signal levels. In this regard, output 678 of the low signal strength comparator 658 will be at a high logic level whenever the analog time signal envelope information (node 672) is above a certain low voltage level, and the output 674 of the high signal strength comparator 654 will be at a low logic level whenever the analog time signal envelope information (node 672) is below a certain high voltage level. If the analog time signal envelope information (node 672) is not between the certain low voltage level and the certain high voltage level, the logic information from the high signal output 674 and the low signal output 678 may be used by the digital processor 310 to change the gain of the VGA 304 and/or the antenna tuning and Q-control unit 302 (FIG. 3).

The digital processor 310 may also adjust the center frequency (Fc) of the high-Q state variable bandpass filter 306 based upon the logic levels of the outputs 678 and 674, the frequency from the differential outputs 680 and/or the time signal information from output 676. The digital processor 310 may auto-correlate the time signal information from the output 676 for tuning of the high-Q state variable bandpass filter 306. The auto-correlation of the demodulated time information may be performed by digitally cross-correlating the demodulated time information and a known time information. The digital processor 310 may also adjust the Q of the high-Q state variable bandpass filter 306 based upon the high and low signal strengths of the outputs 674 and 678, respectively, and auto-correlation of the data information from the output 676. Increased Q will result in a narrower bandwidth of the high-Q state variable bandpass filter 306 and improved reception of the time signal.

Figure 6:
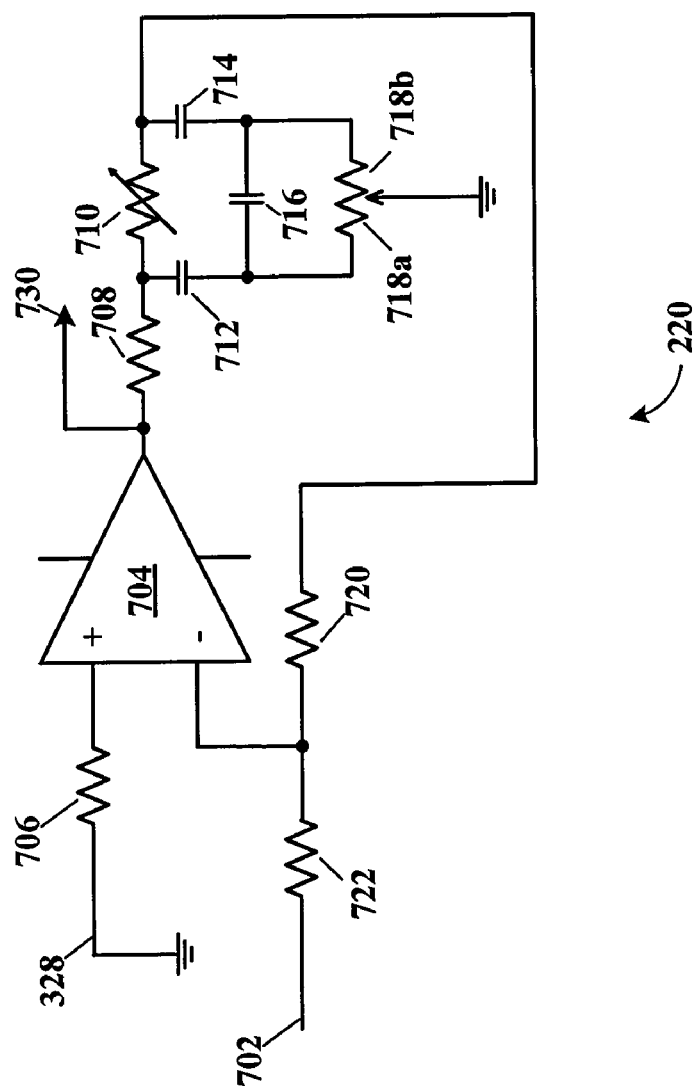
FIG. 6 illustrates a schematic circuit diagram of an anti-notch circuit for the time signal receiver signal frequency bandpass filter, according to another exemplary embodiment of the present invention.

Referring to FIG. 6, depicted is a schematic diagram of an anti-notch filter circuit for the time signal receiver 104, according to other exemplary embodiments of the present invention. The anti-notch filter circuit, generally represented by the numeral 220, may be used to improve front end selectivity of a super-regenerative receiver, e.g., a preferred embodiment of which is more fully described in commonly owned co-pending U.S. patent application Ser. No. 10/670,619, filed Sep. 25, 2003, entitled "Q-Quenching Super-Regenerative Receiver," by Ruan Lourens, and is hereby incorporated by reference herein for all purposes.

The anti-notch filter circuit 220 may be configured as a tuned radio frequency (TRF) receiver, in combination with appropriate information detection circuits and decoding logic, e.g., demodulator 106 and decoder 108. The anti-notch filter circuit depicted in FIG. 6 is configured as a bridged differentiator circuit. The anti-notch filter circuit 220 depicted has substantially independent control (adjustment) of quality (Q) and center frequency. Resistor 710 may be used to adjust the circuit Q independently of the center frequency, Fc. The center frequency may be adjusted by changing the potentiometer 718 tap point represented by the series combination of resistors 718a and 718b. The circuit depicted in FIG. 6 comprises a high gain, narrow band amplifier 704 when resistor 710<6(resistor 718a+resistor 718b). The Q and gain of the circuit increase as resistor 710 approaches 6(resistor 718a+resistor 718b). The maximum gain at the center frequency, Fc, is essentially the open loop gain of the amplifier 704 at Fc, so long as the feedback remains negative.

The anti-notch filter circuit 220 may also be used as a high Q resonator when resistor 710>6(resistor 718a+resistor 718b). In the transition region before this resonance region, higher gains may be obtained than the normal open loop gain of the amplifier 704. In addition, very high Q is also achieved. The circuit disclosed herein is well suited for fabrication in an integrated circuit. Parasitic effects may be cancelled by adjusting one of the capacitors 712, 714 or 716, or resistor 720, 708 or 722. The circuit implementation illustrated in FIG. 6 allows good frequency selectivity without the need for an expensive crystal filter.

FIG. 6 depicts the bridge circuit coupled in the output feedback loop. An input signal may be coupled at node 702 or 328 (702 and 328 may alternate between signal input and ground) and an output signal taken from node 730 of the circuit depicted in FIG. 6.

The invention, therefore, is well adapted to carry out the objects and attain the ends and advantages mentioned, as well as others inherent therein. While the invention has been depicted, described, and is defined by reference to exemplary embodiments of the invention, such a reference does not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A system for receiving and decoding a radio frequency time signal, said system comprising:
   an antenna for receiving a radio frequency time signal;
   a variable gain amplifier coupled to said antenna;
   a state variable bandpass filter coupled to said variable gain amplifier, where said state variable bandpass filter is tuned to the radio frequency time signal carrier frequency;
   a time signal detector for demodulating time information from the radio frequency time signal, said time signal detector coupled to said state variable bandpass filter; and
   a digital processor coupled to and controlling said variable gain amplifier and said state variable bandpass filter, said digital processor receiving the demodulated time information from said time signal detector,
   wherein said digital processor controls tuning of said state variable bandpass filter to the carrier frequency of the radio frequency time signal by auto-correlating the demodulated time information with a know time information format; and
   wherein said variable gain amplifier, said state variable bandpass filter, said time signal detector and said digital processor are fabricated on an integrated circuit die.

2. The system of claim 1, wherein said antenna is parallel resonant at the radio frequency time signal carrier frequency.

3. The system of claim 1, further comprising a high level signal strength logic circuit and a low level signal strength logic circuit for determining when reception of the radio frequency time signal is less than a low signal level and above a high signal level.

4. The system of claim 3, wherein:
   the high level signal strength logic circuit is at a first logic level when the radio frequency time signal is less than or equal to the high signal level and is at a second logic level when the radio frequency time signal is greater than the high signal level; and
   the low level signal strength logic circuit is at a first logic level when the radio frequency time signal is less than or equal to the low signal level and is at a second logic level when the radio frequency time signal is greater than the low signal level.

5. The system of claim 4, wherein the high level signal strength logic circuit and the low level signal strength logic circuit are used in controlling how much said variable gain amplifier amplifies the radio frequency time signal coupled to said state variable bandpass filter.

6. The system of claim 1, further comprising an antenna tuner coupled between said antenna and said variable gain amplifier, wherein said antenna tuner is controlled by said digital processor.

7. The system of claim 1, wherein the digital processor is selected from the group consisting of microcontroller, microprocessor, programmable logic array (PLA), application specific integrated circuit (ASIC) and digital signal processor (DSP).

8. The system of claim 1, wherein the auto-correlation of the demodulated time information is performed by digitally cross-correlating the demodulated time information and the known time information.

9. The system of claim 1, wherein the digital processor controls said state variable bandpass filter bandwidth (Q).

10. The system of claim 1, wherein said state variable bandpass filter may be tuned from about 38 kHz to about 77 kHz.

11. The system of claim 1, further comprising an anti-notch filter circuit.

12. The system of claim 11, wherein the anti-notch circuit is a bridge circuit.

13. The system of claim 12, wherein the bridge circuit is in a feedback path coupled to the amplifier output.

14. The system of claim 11, wherein adjustments of quality (Q) and center frequency of the anti-notch filter circuit are substantially independent.

15. The system of claim 11, wherein the anti-notch filter circuit is a bandpass filter circuit having high quality (Q).

16. The system of claim 1, further comprising a time register for storing time information from the demodulated and decoded time signal.

17. The system of claim 1, further comprising packaging the integrated circuit die in an integrated circuit package.

18. The system of claim 17, wherein the integrated circuit package is selected from the group consisting of PDIP, SOIC, MSOP, TSSOP, and QSOP.

* * * * *